United States Patent
Olson et al.

(10) Patent No.: US 10,067,170 B2
(45) Date of Patent: Sep. 4, 2018

(54) POWER LINE PROXIMITY SENSING AND WARNING SYSTEM

(71) Applicant: UNITED SAFETY, INC., Kalispell, MT (US)

(72) Inventors: Mark C. Olson, Racine, WI (US); Ryan W. Johnson, Bigfork, MT (US); Stephen L. Smith, Kalispell, MT (US)

(73) Assignee: United Safety, Inc., Kalispell, MT (US)

( * ) Notice: Subject to any disclaimer, the term of this patent is extended or adjusted under 35 U.S.C. 154(b) by 370 days.

(21) Appl. No.: 14/806,183

(22) Filed: Jul. 22, 2015

(65) Prior Publication Data
US 2015/0323580 A1 Nov. 12, 2015

Related U.S. Application Data

(63) Continuation-in-part of application No. 13/730,827, filed on Dec. 28, 2012, now Pat. No. 9,501,930.
(Continued)

(51) Int. Cl.
| | |
|---|---|
| *G01B 7/14* | (2006.01) |
| *G08G 1/00* | (2006.01) |
| *G01R 29/08* | (2006.01) |
| *G01V 3/12* | (2006.01) |
| *G08B 21/02* | (2006.01) |
| *G01V 3/10* | (2006.01) |
| *G01V 3/15* | (2006.01) |

(52) U.S. Cl.
CPC ............ *G01R 29/085* (2013.01); *G01V 3/10* (2013.01); *G01V 3/12* (2013.01); *G01V 3/15* (2013.01); *G08B 21/02* (2013.01)

(58) Field of Classification Search
CPC .......... G01R 29/085; G01V 3/15; G01V 3/10; G01V 3/12; G08B 21/02
USPC .......................... 324/207.22, 207.2; 340/901
See application file for complete search history.

(56) References Cited

U.S. PATENT DOCUMENTS

| | | |
|---|---|---|
| 3,786,468 A | 1/1974 | Moffitt |
| 3,907,136 A | 9/1975 | Christides et al. |

(Continued)

FOREIGN PATENT DOCUMENTS

| | | | |
|---|---|---|---|
| EP | 2479735 | 7/2012 | |
| WO | WO 2007142515 A1 * | 12/2007 | ........... H01L 31/048 |

OTHER PUBLICATIONS

Installation Procedure for the ASE 2200 High Voltage Proximity Warning Device, Allied Safety Engineering, Feb. 21, 2006.
(Continued)

*Primary Examiner* — Farhana Hoque
(74) *Attorney, Agent, or Firm* — Hamre, Schumann, Mueller & Larson, P.C.

(57) ABSTRACT

A wireless power line sensing device can include an external antenna port that permits connection of an external loop antenna to the wireless power line sensing device. The external loop antenna can be used in place of the integral loop antenna which can be disabled when the external loop antenna is connected. The external loop antenna can extend substantially linearly to define a non-spherical sensing field. The wireless sensing device can also include an ultracapacitor that provides power to the wireless sensing device and/or a curved solar panel that maximizes the solar input over a wide range of angles, providing power over a longer period of time compared to a flat solar panel.

20 Claims, 13 Drawing Sheets

Related U.S. Application Data

(60) Provisional application No. 61/580,918, filed on Dec. 28, 2011.

(56) References Cited

U.S. PATENT DOCUMENTS

| | | | |
|---|---|---|---|
| 5,252,912 A | 10/1993 | Merritt et al. | |
| 5,592,092 A | 1/1997 | Mechler | |
| 6,104,305 A | 8/2000 | Beckmann | |
| 6,133,841 A | 10/2000 | Beckmann | |
| 6,170,607 B1 | 1/2001 | Freeman et al. | |
| 6,252,513 B1 | 6/2001 | Beckmann | |
| 6,600,426 B1 | 7/2003 | Sacks et al. | |
| 6,810,353 B2 | 10/2004 | Schiffbauer | |
| 6,853,307 B2 * | 2/2005 | Nickerson | B66C 15/065 |
| | | | 340/551 |
| 7,081,812 B2 | 7/2006 | Hastings, Sr. | |
| 2004/0066284 A1 | 4/2004 | Hastings, Sr. | |
| 2004/0183522 A1 * | 9/2004 | Gunn | G01R 15/185 |
| | | | 324/126 |
| 2006/0094368 A1 * | 5/2006 | Lee | H04B 7/0808 |
| | | | 455/67.13 |
| 2006/0271263 A1 | 11/2006 | Self et al. | |
| 2007/0018841 A1 | 1/2007 | Nickerson | |
| 2009/0237263 A1 | 9/2009 | Sawyer et al. | |
| 2010/0214094 A1 * | 8/2010 | Givens | B66C 13/44 |
| | | | 340/539.17 |
| 2010/0286845 A1 | 11/2010 | Rekow et al. | |
| 2010/0320967 A1 * | 12/2010 | Sa | H01M 2/1022 |
| | | | 320/112 |

OTHER PUBLICATIONS

Proxyvolt Instruction Manual PV5007II, Proxyvolt Pty Ltd, date unknown.
Proxyvolt PV5007 Brochure, Proxyvolt Pty Ltd, 1717 Ipswich Road, Rocklea Qld Australia 4106, date unknown.
Proxyvolt Quick Start Guide (Label), Proxyvolt Pty Ltd, date unknown.
Sigalarm Model 110 Lattice Boom Manual, Sigalarm, 5224 West State Road 46 PMB 405, Sanford, FL32771, 2010.
Wire-Watcher Brochure, The Wire-Watcher Co. Ltd, Gigg Mill, Old Bristol Rd, Nailsworth GL6 OJP, United Kingdom, date unknown.
http://www.alliedsafetyeng.com/proximity_warning_device.html, Allied Safety Systems, Inc., 4380 St. Johns Parkway, Suite 100 Sanford FL 32771, 2009.
http://www.sigalarmic.com/index.html, Sigalarm, 5224 West State Road 46 PMB 405, Sanford, FL 32771, date unknown.
http://www.wirewatcher.co.uk/wwprd.html, The Wire-Watcher Co. Ltd, Gigg Mill, Old Bristol Rd, Nailsworth GL6 0JP, United Kingdom, 2005.
Examination report issued for corresponding Australian patent application No. 2014201818, dated May 5, 2017 (5 pages).

* cited by examiner

POWER LINE PROXIMITY SENSING AND WARNING SYSTEM

FIELD

This description relates generally to proximity sensors. More particularly, this description relates to power line proximity sensing and warning systems, for enhanced safety of operators and their machinery around high voltage power lines. The embodiments disclosed herein may be configured as standalone power line warning device (PWD) systems or may be used in conjunction with each other or with other conventional PWD systems.

BACKGROUND

Conventional power line proximity alarms are electronic radio units designed to detect the electromagnetic field that surround active high voltage power lines. This electromagnetic field is detected or sensed, thereby generating warning sounds to alert the operator of the machinery equipped with the power line warning device (PWD) that a high voltage has been detected within the vicinity of the machine.

Currently, the PWD market offers products that are analog based (fused). Such systems are purchased individually and perform a simple and single function of warning when an equipped piece of machinery is approaching a high voltage power line.

SUMMARY

The embodiments described herein provide a user-friendly approach to power line safety through a full line of completely digital and highly technical products that are interactive, collective, supportive of each other, simple to operate and ancillary to a base/main unit that can be configured in an array of combinations to accommodate any articulating, overhead boomed or extending mobile equipment type. The embodiments disclosed herein are believed to be more accurate, dependable than conventional systems and include a wider range of options and features that no other PWD on the market offers.

A number of innovative features are described that can be used individually or in any combination to enhance the operation of the described PWD. In one embodiment, a wireless power line sensing device can include an external antenna port that permits connection of an external, initially separate loop antenna to the wireless power line sensing device. The external loop antenna can be used in place of the integral loop antenna of the wireless power line sensing device which can be disabled when the external loop antenna is connected to the external antenna port. In one embodiment, the external loop antenna can extend substantially linearly so that in use the external loop antenna extends longitudinally over a length of a structure to which it is attached to define a non-spherical sensing field.

In another embodiment, a wireless sensing device, such as a wireless power line sensing device, can include an ultracapacitor that provides power to the wireless sensing device. Unlike conventional rechargeable batteries, an ultracapacitor can be recharged in low temperature environments. In addition, an ultracapacitor can withstand a large number of charge cycles, and can be charged more quickly than a rechargeable battery. These advantages, and others, are beneficial when the sensing device is used in a remote or difficult to access location, such as with a wireless power line sensing device.

In another embodiment, a wireless sensing device, such as a wireless power line sensing device, can include a curved solar panel. The curved solar panel maximizes the solar input over a wide range of angles, providing power over a longer period of time compared to a flat solar panel.

In one embodiment, a wireless power line sensing device includes a housing having a base, a first end, and a second end. A power source is disposed in the housing, and a controller in the housing is connected to the power source so that it is powered thereby. An integral loop antenna that senses an electromagnetic field is connected to the controller. A wireless communication mechanism in the housing provides communication between the sensing device and a remote location, such as with a base unit or a remote control unit. In addition, an external antenna port on the housing permits connection of an external loop antenna to the housing to permit a change in the sensing field of the wireless power line sensing device.

In another embodiment, a wireless sensing device is provided. The wireless sensing device can be configured to perform any sensing function(s). One example of the wireless sensing device includes, but is not limited to, configuration as a wireless power line sensing device. The sensing device includes a housing, an ultracapacitor disposed in the housing that stores electrical energy, a solar panel mounted on an exterior of the housing and electrically connected to the ultracapacitor to electrically charge the ultracapacitor, a sensing mechanism connected to the housing that senses a condition external to the housing, a controller in the housing that is connected to and controls the sensing mechanism, and a radio frequency transceiver in the housing and connected to the controller that provides communication between the sensing device and a remote location, such as with a base unit or a remote control unit.

In another embodiment of a wireless sensing device that can be configured to perform any sensing function(s), for example a wireless power line sensing function, the wireless sensing device can include a housing, a power source disposed in the housing that stores electrical energy, and a solar panel mounted on an exterior of the housing and electrically connected to the power source to electrically charge the power source. The solar panel can be curved to maximize the solar input over a wide range of angles. The sensing device can also include a sensing mechanism connected to the housing that senses a condition external to the housing, a controller in the housing that is connected to and controls the sensing mechanism, and a radio frequency transceiver in the housing and connected to the controller.

DRAWINGS

Figure 5A:
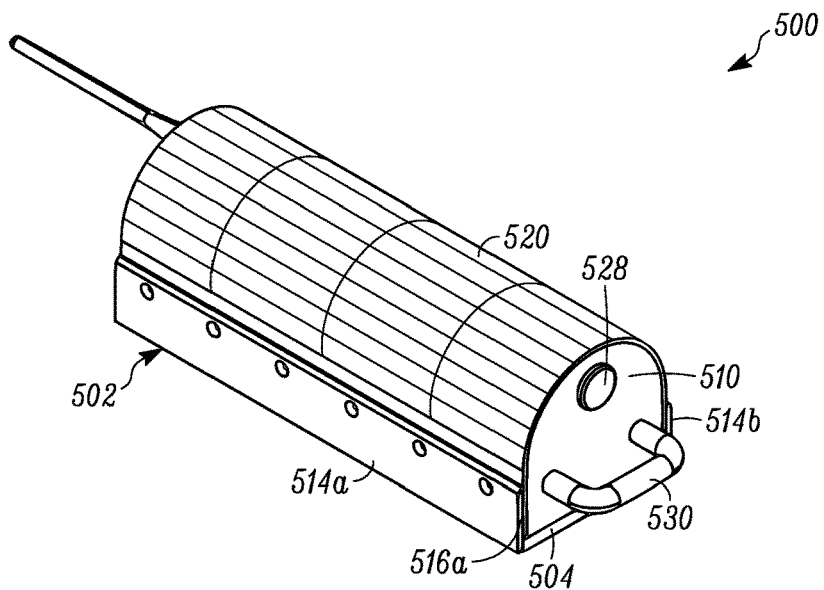
FIGS. 5A, 5B and 5C are perspective views of an embodiment of a wireless power line sensing device described herein.
Figure 5B:
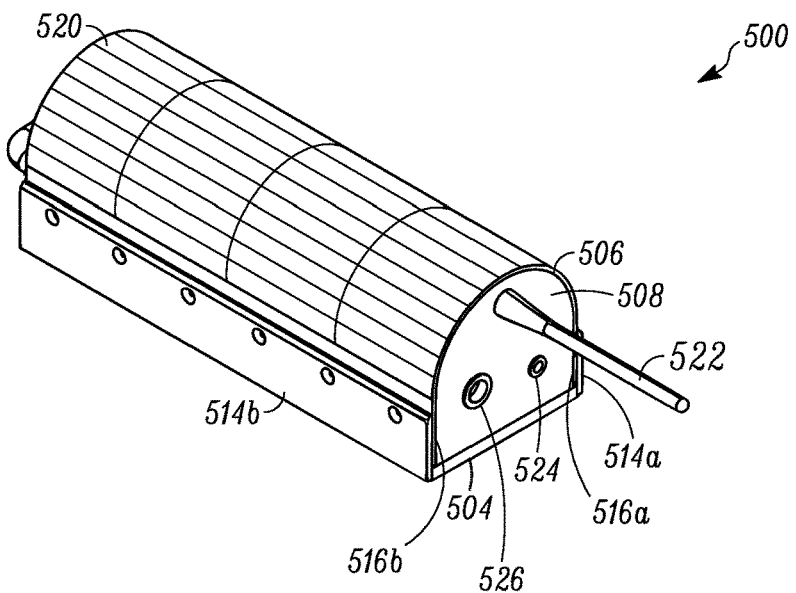
Figure 5C:
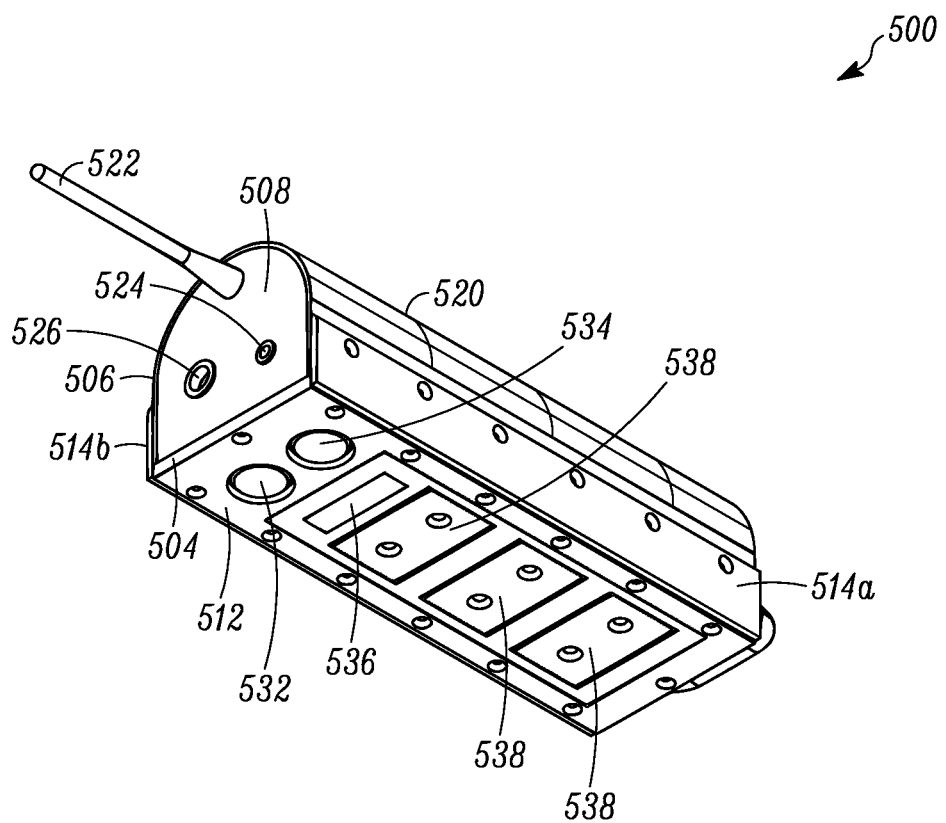

FIGS. 6A-G are end views of an embodiment of a curved solar panel used on the wireless power line sensing device of FIGS. 5A-C, showing solar input to the curved solar panel over different angles.

Figure 7:
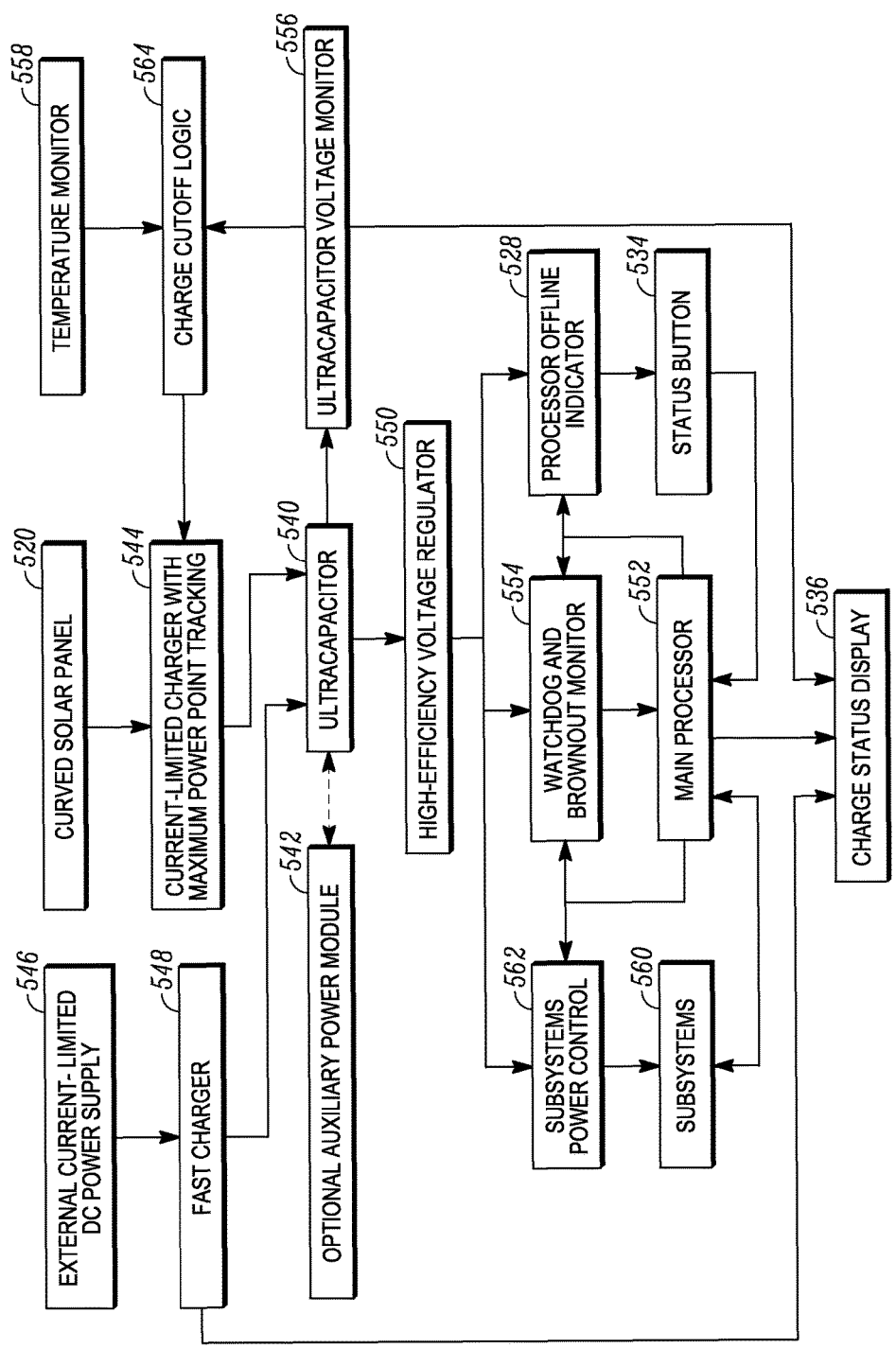

FIG. 7 is a schematic illustration of an embodiment of a power control system used on the wireless power line sensing device of FIGS. 5A-C.

Figure 8:
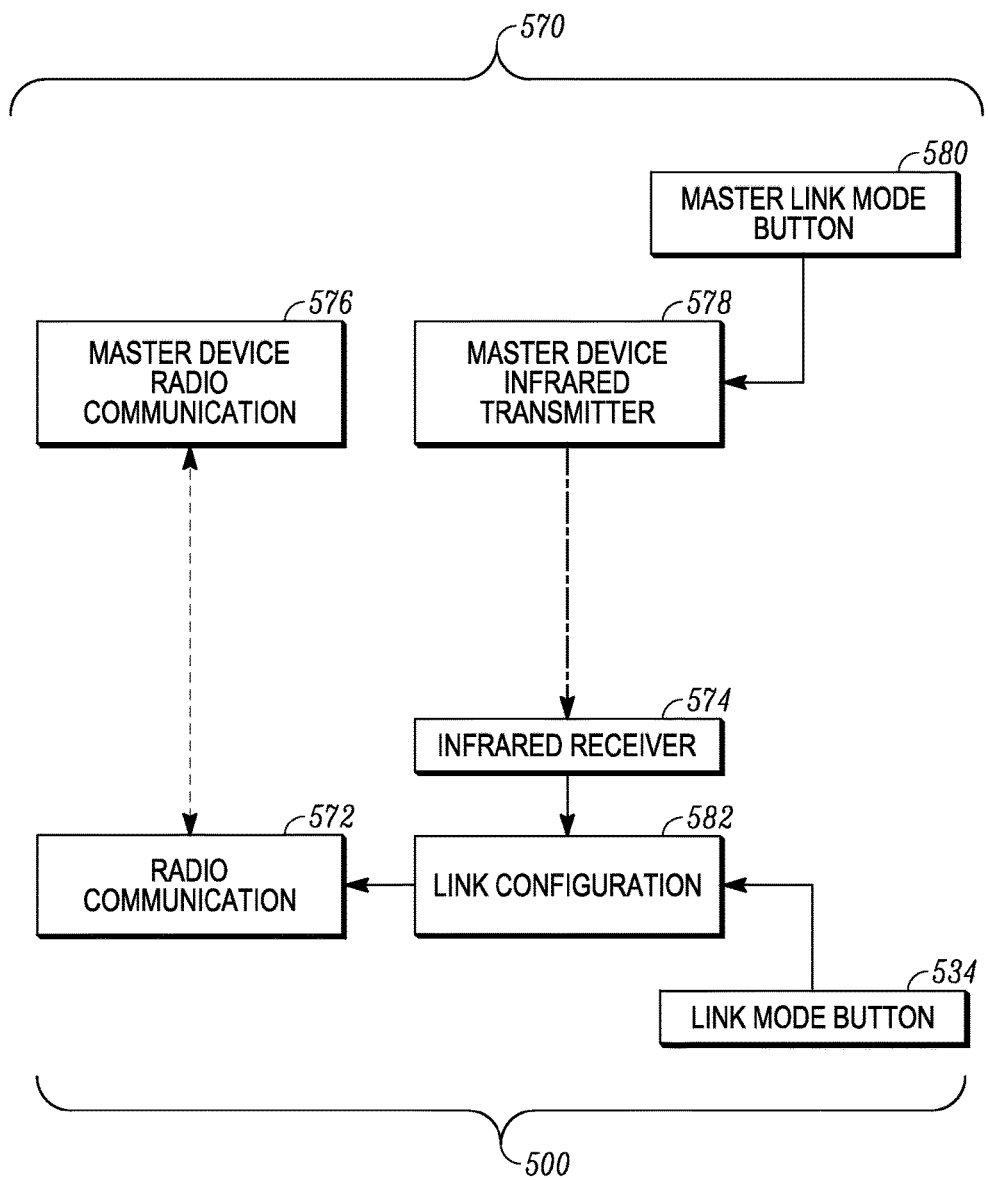

FIG. 8 is a schematic illustration of an embodiment of a linking scheme used with the wireless power line sensing device of FIGS. 5A-C for linking the wireless power line sensing device with a remote device.

Figure 9A:
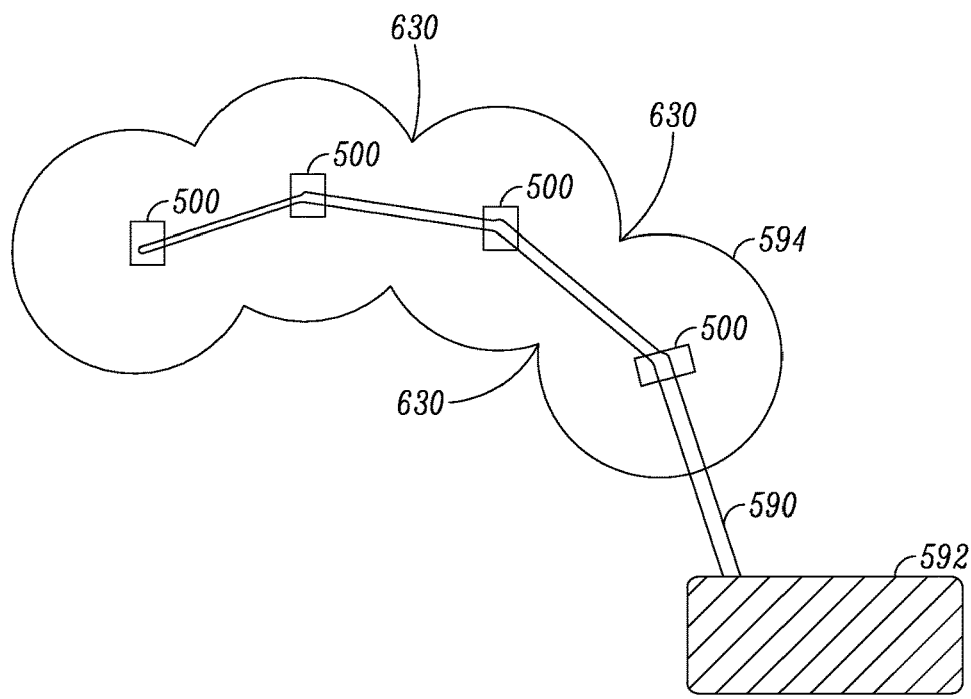

FIG. 9A illustrates the sensing field generated by integral loop antennas of a plurality of the wireless power line sensing devices of FIGS. 5A-C disposed along an extendable boom.

Figure 9B:
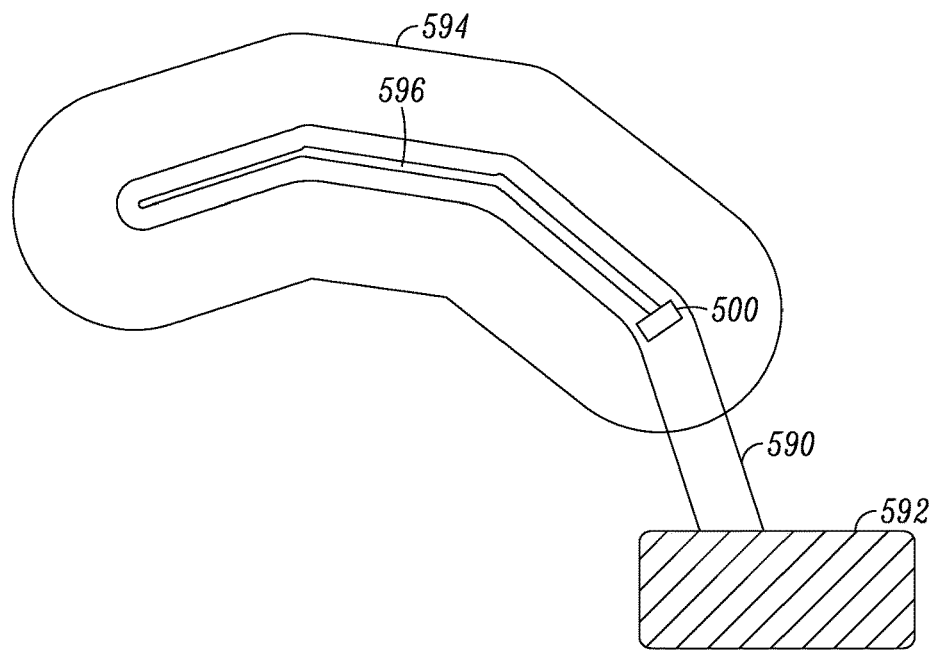

FIG. 9B illustrates the sensing field generated by an external loop antenna that is connected to the wireless power line sensing device of FIGS. 5A-C, with the external loop antenna disposed along an extendable boom.

Figure 10:
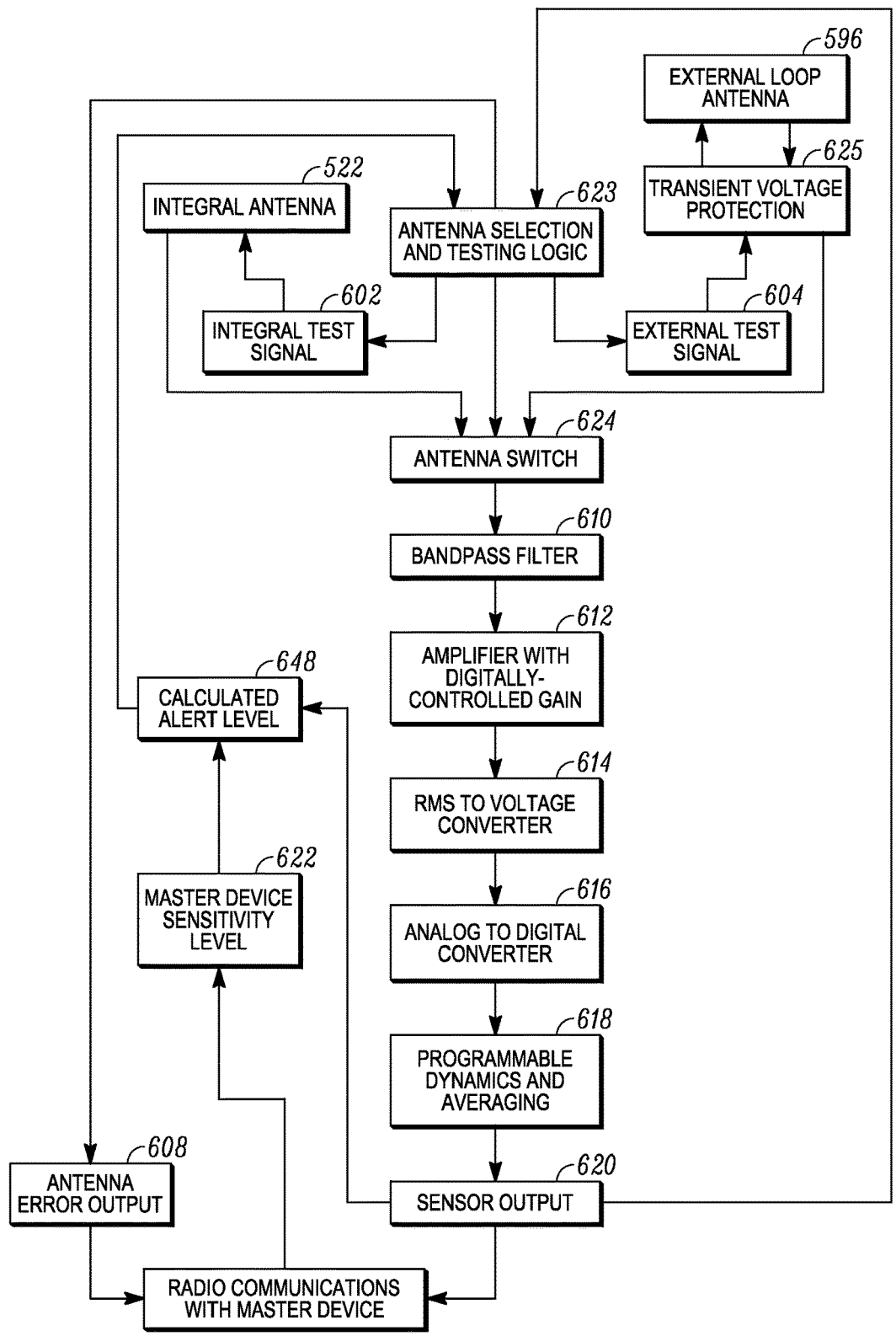

FIG. 10 is a schematic illustration of an embodiment of a power line sensing control scheme used with the wireless power line sensing device of FIGS. 5A-C for sensing a power line.

Figure 11:
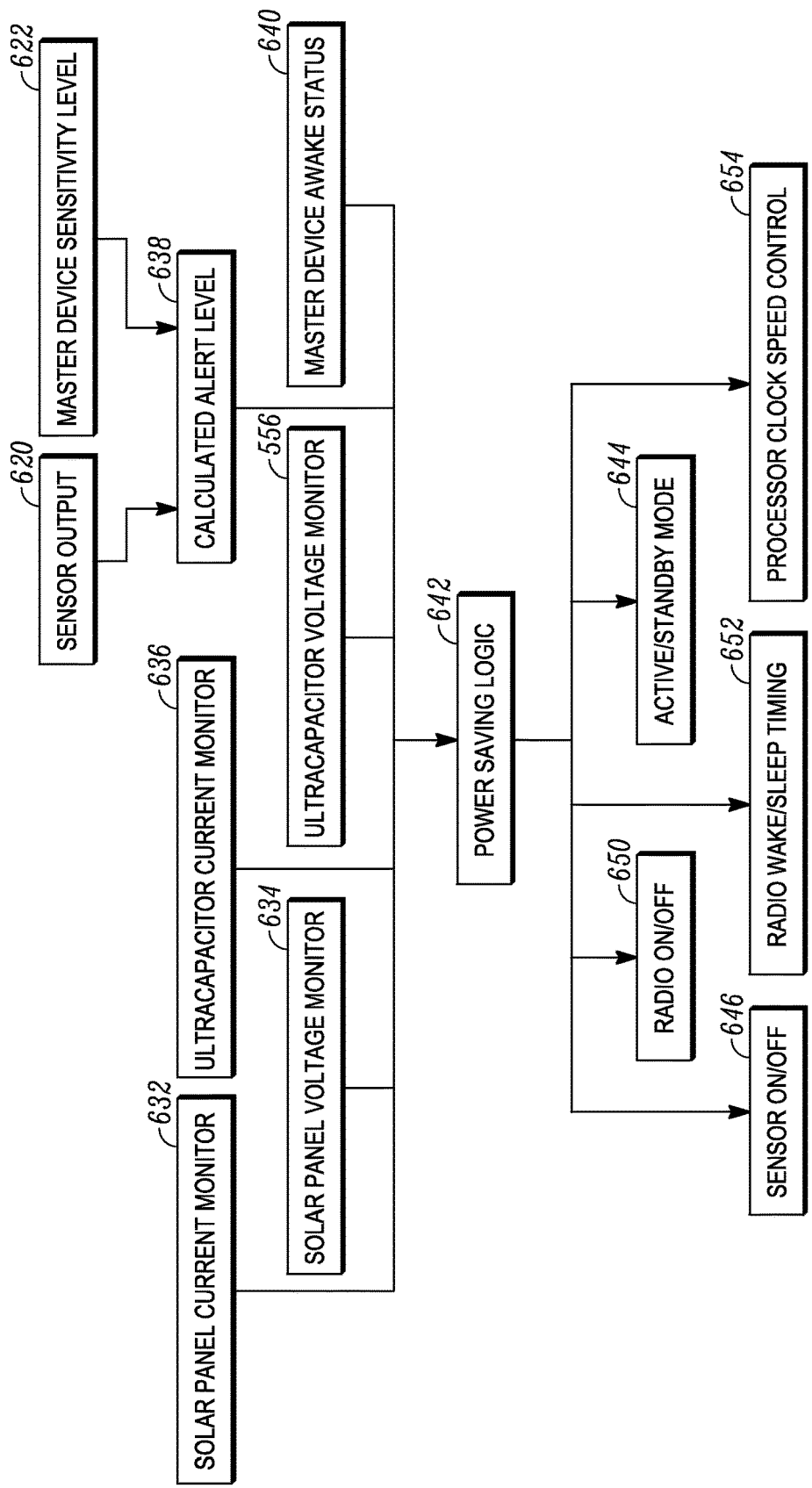

FIG. 11 is a schematic illustration of an embodiment of a power control scheme used with the wireless power line sensing device of FIGS. 5A-C.

DETAILED DESCRIPTION

This application describes a novel suite of power line proximity sensing and warning systems, having a base or general configuration that may be upgraded with various enhanced feature embodiments and still other embodiments which may be incorporated into existing PWD systems. The embodiments disclosed herein may be configured as stand-alone PWD systems or may be used in conjunction with each other or with other conventional PWD systems.

The various embodiments described herein provide a user-friendly approach to power line safety by manufacturing a full line of completely digital and highly technical products that are interactive, collective, supportive of each other, simple to operate and ancillary to a base/main unit that can be configured in an array of combinations to accommodate any articulating, overhead boomed or extending mobile equipment type. We believe our designs are more accurate, dependable and offer a wider range of options and features that no other PWD on the market offers. The following is a description of various embodiments of power line proximity sensing devices, accessories and enhancements.

Figure 1:
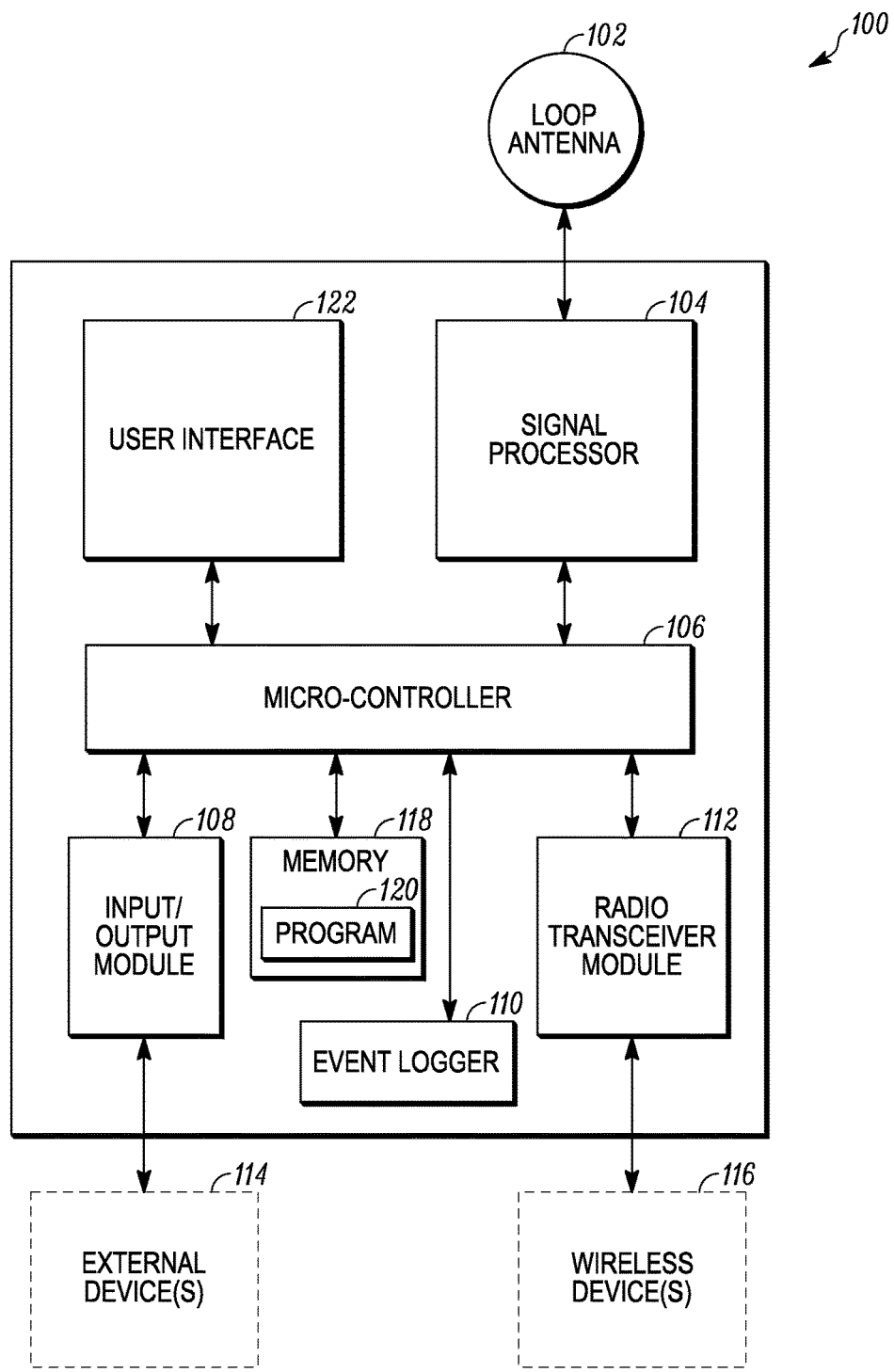
FIG. 1 is a block diagram of an embodiment of a power line proximity sensing and warning system described herein.

FIG. 1 is a block diagram of an embodiment of a power line proximity sensing and warning system 100 for use by an operator of machinery operating near high-voltage power lines. A commercial embodiment of system 100 is known as Voltek NS™ is available from United Safety, Inc., Kalispell, Mont. System 100 may include a loop antenna 102 disposed about a structure (not shown) of the machinery (not shown). The structure, e.g., a crane boom, is generally configured for movement near the power lines. Antenna 102 runs along the boom of the machinery. The antenna is a loop of wire with both ends connected to the signal processor 104 input. One embodiment of the signal processor 104 processes and filters the incoming signal and includes the following features, 60 band-pass filter, dynamics compression (apply a specific response curve), gain, and read signal amplitude.

The loop antenna 102 may be in communication with a signal processor 104. Signal processor 104 may be a digital signal processor or any other suitable signal processor capable of sending test signals through the loop antenna 102 and receiving those test signals to confirm proper antenna operation. Signal processor 104 may also be configured for receiving field strength signals from the loop antenna 102 generated by an electromagnetic field generated by the power lines (not shown, but see FIG. 3 and related discussion) proximate to the loop antenna 102.

The system periodically performs an antenna self-test: Normally, both ends of the antenna wire are connected to the DSP Input. For self-test mode, a set of relays disconnects one end from the DSP Input and connects it to the DSP Output. The DSP outputs a 60 Hz sine wave test signal. If the antenna 102 is in working condition, the test signal will go through the antenna wire into the DSP Input. If the test signal can be detected, the test is Passed.

System 100 may also include a micro-controller 106 in communication with the signal processor configured for interpreting the received field strength signals from the loop antenna and comparing the received field strength signals to a user-adjustable, sensitivity level. Sensitivity adjustments allow the operator to set a warning distance based on the strength of the electromagnetic field surrounding the power line. Micro-controller 106 may further be configured for generating a proximity signal based on the received field strength signal. Micro-controller 106 may further be configured for graphically displaying the proximity signal on a color display, and audibly warning the operator when the proximity signal exceeds preset levels of field sensitivity.

The micro-controller 106 may be configured to read the signal amplitude and calculates a value based on the user-adjustable sensitivity level. The reading is displayed on a color-coded display meter. The three levels displayed are:
  GREEN—Safe Zone: the equipment is operating in at a safe distance from power lines.
  YELLOW—Warning Zone: the equipment is operating closer to power lines than the set safe distance. The Warning indicator turns on and the horn emits a pulse tone, reminding the operator to back the equipment away from the power lines until it is in the Safe Zone.
  RED—Danger Zone: the equipment is dangerously close to power lines. The shutdown indicator turns on, the horn emits a solid tone, and the equipment is forced to shut down by engaging the Emergency Stop system, (e.g., emergency shutdown button 206, FIG. 2).

System 100 may further include an input/output (I/O) module 108 in communication with the micro-controller 106. The I/O module 108 may be configured for communicating with external devices, e.g., other computers or computer peripherals for retrieving data from the system 100 or for programming system 100. Communications through the I/O module 108 may be according to any known serial or parallel synchronous or asynchronous interface standard, e.g., universal serial bus (USB). Such computer data communications interfaces are well-known to those skilled in the art and, thus, will not be further elaborated herein.

System 100 may further include an event logger 110 in communication with the micro-controller 106 for recording user interface button presses, user interface sensitivity adjustments, received field strength signals, alerts generated, alarms generated, system cable connections, power loss, errors and system status, all as a function of time. According to one embodiment, an integrated event logger is capable of generating a record of these events. These records can be accessed by any suitable computer (external device, shown at dotted box 114) installed with an appropriately coded software program, referred to herein as Voltek Systems™ Core™ software (not shown). The event logger 110 may include an internal date/time clock with a battery power backup to keep it running even when the system 100 is disconnected from power. Whenever such an external computer running Voltek Systems™ Core™ software downloads events from system 100, it automatically synchronizes the event logger 110 clock with the computer's clock.

System 100 may further include a radio transceiver module 112 in communication with the micro-controller 106. The radio transceiver module 112 may be configured for wireless communication with external wireless devices. System 100 may further include memory 118 in communication with micro-controller 106. Memory 118 may be configured to store data from the event logger 110 or software programming code (program 120) with instructions for operating the micro-controller 106. According to one embodiment, a USB wireless adapter allows an external computer running Voltek Systems™ Core™ to wirelessly download events and perform other actions without having to connect a USB cable directly to system 100, however the option of doing so is available through I/O module 108.

Figure 2:
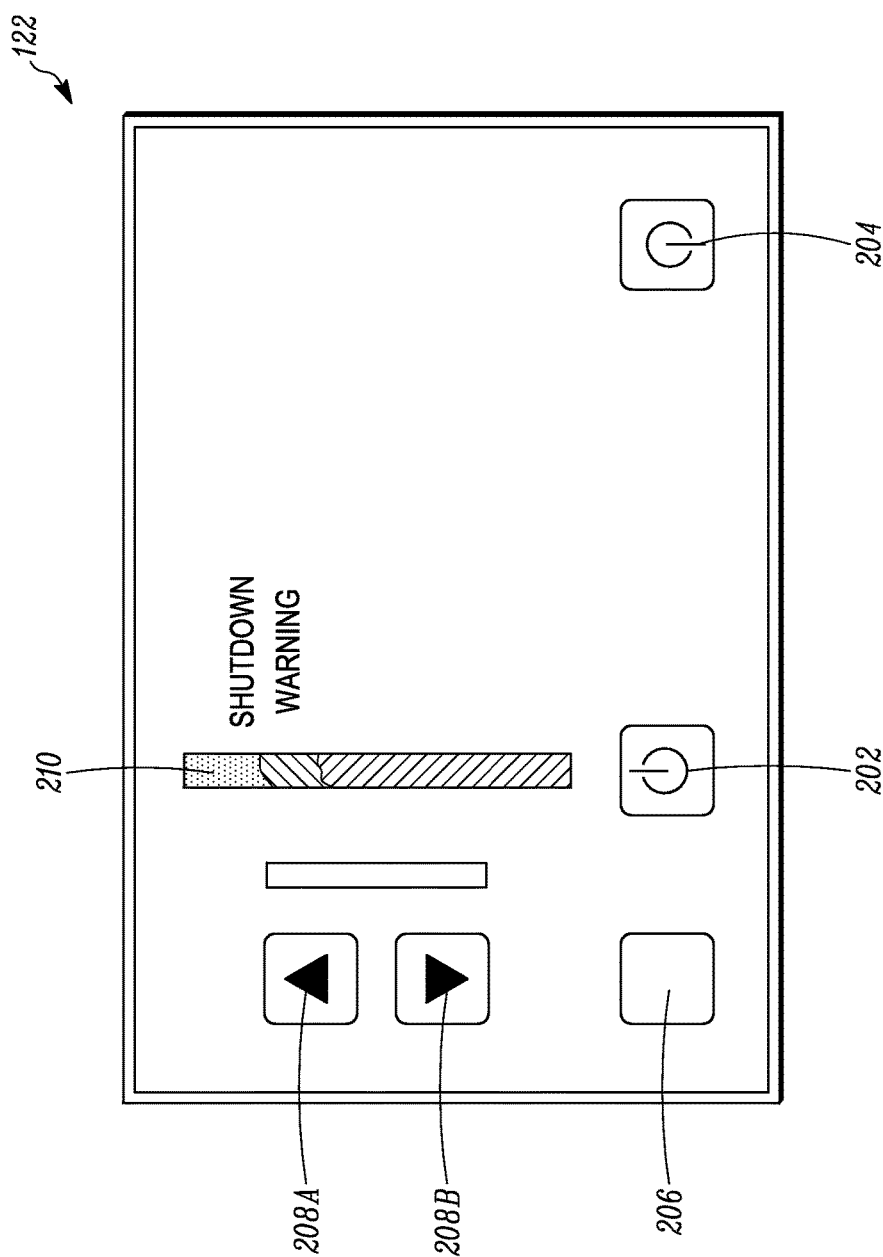
FIG. 2 is an embodiment of a user interface for use with the power line proximity sensing and warning system shown in FIG. 1, as described herein.

FIG. 2 is an embodiment of a user interface 122 for use with the power line proximity sensing and warning system 100 shown in FIG. 1. User interface 122 may include a power button 202 used to turn the system 100 on and off. User interface 122 may also include a wireless link button 204 for wirelessly linking the system 100 with one or more remote wireless devices. According to one embodiment, a two-way digital messaging system allows communication with remote wireless accessories over the radio transceiver module 112. User interface 122 may also include an emergency shutdown button 206 that stops the machinery from further movement. User interface 122 may also include sensitivity adjust up 208A and down 208B buttons for manually configuring the sensitivity of system 100. User interface 122 may also include a graphical display using a red-yellow-green field strength bar 210. The graphical display may further include "shutdown" and "warning" indicators that flash or illuminate, according to the illustrated embodiment.

The Voltek Shadow™, available from United Safety, Inc., Kalispell, Mont. (the assignee of this application) is a remote control (see FIG. 3, 314) for system 100, an embodiment known as Voltek NS™ is also available from United Safety, Inc. The Voltek Shadow™ is a battery-powered remote controller (see FIG. 3, 314) for system 100, also referred to herein as Voltek NS™ or the Voltek NS™ Powerline Proximity Alarm. The Voltek Shadow™ uses two-way radio communication (radio transceiver 112) to allow remote operation and view the status of the main unit while operating the equipment from outside the cab or when a spotter needs to monitor power line safety from an outside viewpoint.

Unlike many conventional remote control devices, any The Voltek Shadow™ can be easily linked to any Voltek NS™ (system 100) without the hassle of connecting a cable, shipping the units to the manufacturer to be reprogrammed, or entering codes. Simply turn on both devices, press the link button on each device, and point the Voltek Shadow™ at the Voltek NS™. The units instantly recognize each other and establish a radio link. This is very useful in situations where you have multiple units in charging cradles. Simple grab any one of them, take it to the equipment you will be using for that day, and link the devices together. According to one embodiment, the Voltek Shadow™ has the exact same controls as the Voltek NS™ with the addition of a "panic button" that lets a spotter either warn the operator of a hazard or shutdown the machine remotely to prevent an accident. The Voltek Shadow™ also alerts the user when radio communication has been lost or the battery is low. Voltek Shadow™ has a serial number, so each main unit can establish a link with a specific remote unit without interfering with other nearby units. A proprietary messaging system sends messages between units to communicate button presses, sensor readings, status changes, event log data, etc. The Link button 204 on user interface 122 of system 100 may include an Infrared LED under it. The Voltek Shadow™ enclosure may include an Infrared receiver under an infrared-passing window in the front of the enclosure.

The remote unit links to the main unit like this:
Turn on both units;
press the Link button on each unit;
point the remote at the main unit. The main unit transmits an ID code to the remote unit via an Infrared transmitter.
The remote uses the ID code to establish a digital radio link with the main unit. The ID code tells the remote what "address" to send messages to when transmitting messages over the radio.

Figure 3:
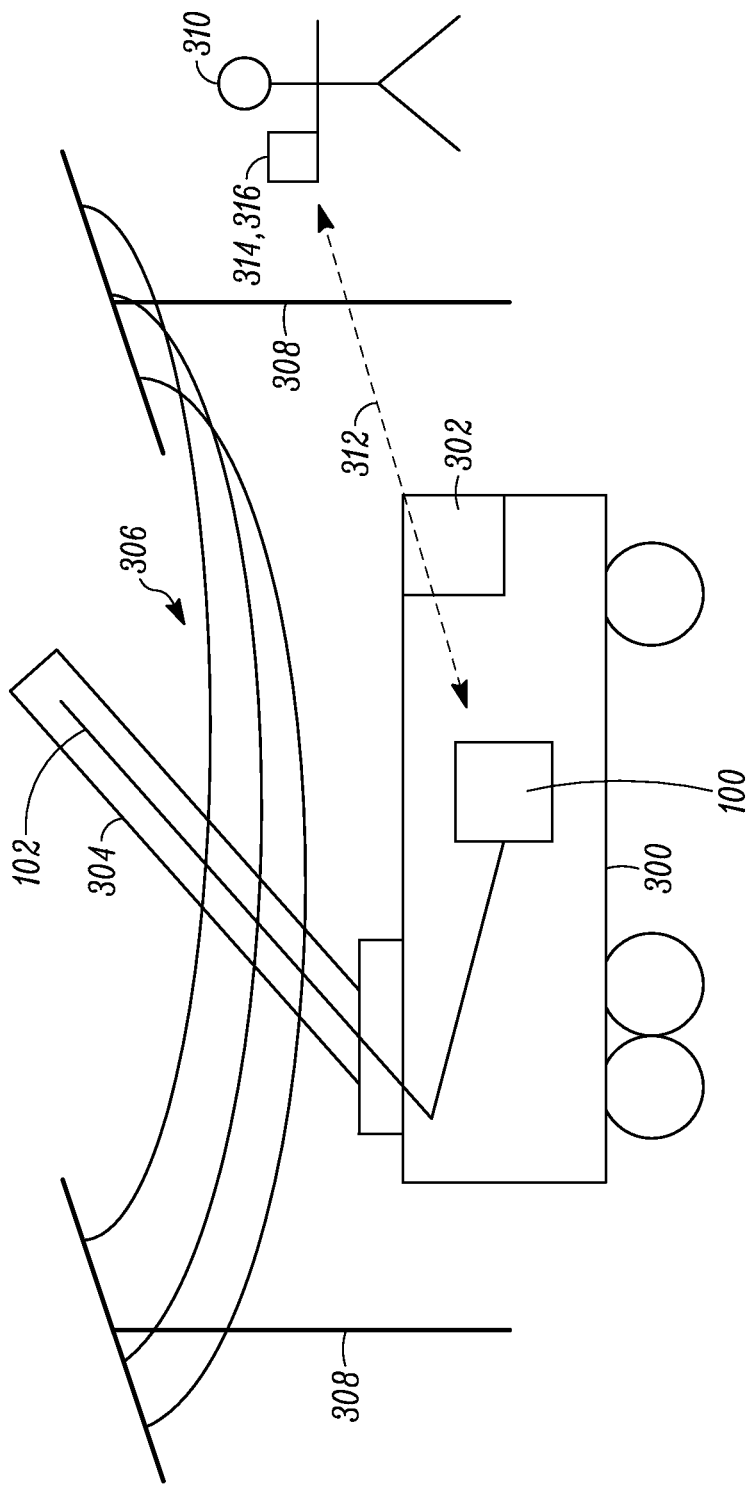
FIG. 3 is a schematic diagram of an environment in which the power line proximity sensing and warning system shown in FIG. 1 might be used, as described herein.

FIG. 3 is a schematic diagram of an environment in which the power line proximity sensing and warning system 100 shown in FIG. 1 might be used. As shown in FIG. 3, a machinery 300 operated by an operator 302 may have an extended structural member, simply structure 304. System 100 once installed, includes the loop antenna 102 disposed about the surface of the structure 304, where it can sense invisible electromagnetic fields from power lines (three shown generally at arrow 306). In the configuration shown in FIG. 3, the operator 302 has access to the user interface 122 of system 100, typically in the cab of the machinery. From that position, operator 302 can control the system 100 directly. Alternatively, a remote user 310 can control system 100 using a wireless remote controller 314, e.g., the Voltek Shadow™ Remote user may also be holding a wireless computer 316 running Voltek Systems™ Core™ software.

Figure 4:
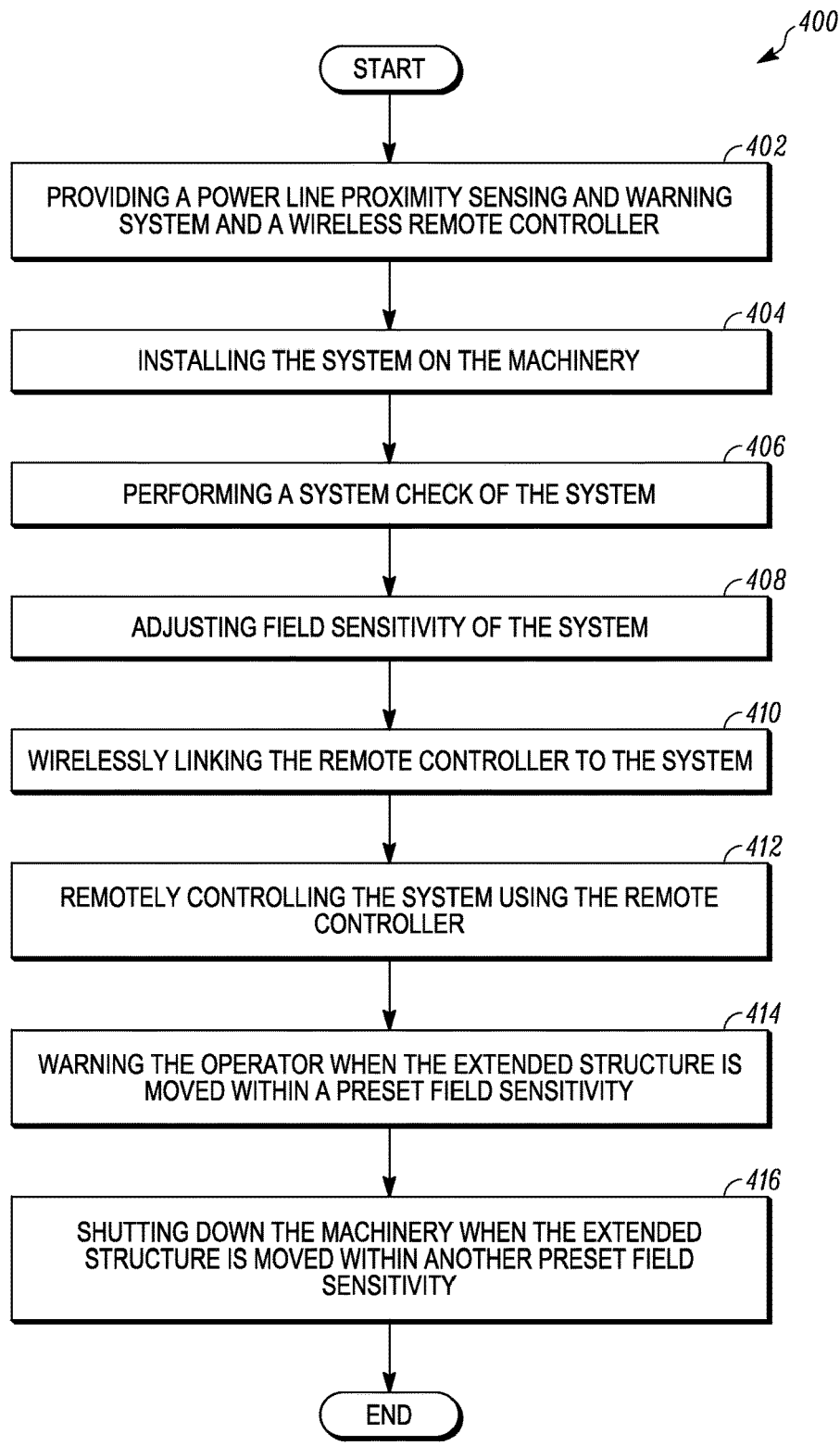
FIG. 4 is a flowchart of an embodiment of a method for remotely alerting an operator of machinery when an extended structure of the machinery is moved near high voltage power lines, as described herein.

FIG. 4 is a flowchart of an embodiment of a method for remotely alerting an operator of machinery when an extended structure of the machinery is moved near high voltage power lines, according to the present invention.

An upgraded feature referred to herein as "Voltsense™", may be added to the "Voltek NS™" embodiment in order to form a wireless antenna sensor PWD system. Another embodiment, referred to herein as "Voltek Shadow™" is a hand held remote for use with the general "Voltek NS™" embodiment, with or without the "Voltsense™" upgrade, for spotters or operators controlling machinery remotely. Another upgrade embodiment, referred to herein as "Line Defense WL™", replaces the wired sensor antenna of the "Voltek NS™" embodiment with access to the load cable as a wireless sensor antenna by way of a novel connector referred to herein a "Pour Cap Link™". Still another upgrade embodiment, referred to herein as "Line Defense WD™", extends the wired sensor antenna of the "Voltek NS™" embodiment with access to the load cable as a sensor antenna by way of the "Pour Cap Link™" connector. Yet another embodiment, referred to herein as "Voltek Scribe™" is an upgrade for use with any of the above PWD embodiments and may also be used with other conventional PWDs as an event logger and data recorder. Finally, the "Voltek PD™" embodiment is disclosed. The "Voltek PD™" is a completely standalone PWD device for use on a single person, e.g., first responders, tree trimmers, lineman, etc.

Voltek NS™

A general PWD embodiment, referred to herein as "Voltek NS™", includes a wired antenna sensor. In its most general embodiment, the Voltek NS™ is a PWD for heavy machinery and motorized equipment that warns the operator, spotter, ground crew and by-standers when the machinery is approaching active high voltage power lines. According to one embodiment, the Voltek NS™ detects both 50 Hz and 60 Hz without re-programming or manual setting. U.S. Provisional Patent Application No. 61/747,187 filed on Dec. 28, 2012, titled "VOLTEK NS SYSTEM", the contents of which are expressly incorporated herein by reference as if fully set forth herein, discloses engineering drawings, schematics and bills of materials for a presently preferred embodiment of a power line proximity sensing and warning system, according to the present invention.

To detect electrostatic, or electromagnetic fields, an antenna wire must be connected and placed in or near the field lines emanating from the electromagnetic field source, e.g., high voltage power lines. To ensure that the antenna wire is completely intact, the antenna is looped. Both ends are connected to a control board so that a continuity check can be performed. If there is a break in the wire, an error indicator on the control panel alerts the operator. All basic Voltek NS™ units come with the hard wire antenna. However, this embodiment is configured to be equipped with wireless capability should the owner choose to upgrade to a wireless sensor in the future.

Voltek NS™ utilizes the most modern technologies. Digital signal processors and microprocessors ensure precise and reliable operation of the Voltek NS™. Updatable firmware allows features and behavior to be modified on-site without changing hardware, should the need arise. According to one embodiment, the Voltek NS™ may be configured to operate on 12V or 24V power systems without any changes or need for external converter. Self-resetting circuit protection eliminates the need to replace fuses. Modern digital radio transceivers are utilized for wireless communication with various accessories.

The Voltek NS™ is typically mounted inside the cab of the machine where the operator can interact with the system. Sensitivity adjustments allow the operator to set a warning distance based on the strength of the electrostatic field surrounding the high voltage power line. When the equipment moves inside the set distance, audible and visual alerts are activated. If the operator continues to move toward the power line, the Voltek NS™ can automatically shut down the machinery to prevent contact with the power line. A light emitting diode (LED) bar graph on the control panel indicates the detected field strength and whether the warning or auto-shutdown thresholds have been exceeded.

All Voltek NS units come equipped with an internal "event logger/data recorder" (Voltek Scribe™ technology as described below). Software implementing the method embodiments of the present invention through computer instructions for execution in a microprocessor or other specialized hardware, may be provided at the point of purchase. The software may be loaded onto owner computer (e.g., Windows 7™ or newer). The computer then, by Voltek NS™ universal serial bus (USB) connection, downloads the stored data into the pre-loaded software program for interpretation of the owner as well as view diagnostics, error information, change options and/or upload new firmware and upgrades.

Voltek Shadow™

The Voltek Shadow™ is a wireless hand held remote and alert unit providing the same adjustments and status indicators as the main unit (Voltek NS™). The Voltek Shadow™ is synchronized with the main unit at all times. This wireless remote is useful when the operator is remotely controlling the machinery (e.g., concrete pumps, conveyors, trucks, etc.) or when a spotter needs to observe operation from a ground position.

Voltek Shadow™ has override capabilities to shut down the machinery before or when power line contact is eminent or the operator is maneuvering the machinery blind (cannot see the load). Voltek Shadow™ uses the latest in advanced technology available in wireless, microprocessing and re-chargeable LI battery technology.

VoltSense™

The VoltSense™ feature incorporates wireless remote sensors to the system (Voltek NS™) in order to ensure complete coverage of the machinery without the need of a hard wire antenna. Wireless sensors can be powered by various sources and may be provided in various detecting configurations, according to embodiments of the present invention.

Due to the nature of existing wireless antenna sensing, the sensing or detecting field is typically radial or round in shape. By addition of an external micro-antenna to the wireless sensor and continuing it to a given point, the sensing field becomes linear or elongated, thus, eliminating the need for additional sensors to cover a linear area or object such as a boom or extension as described further below in FIGS. 9a and 9B.

According to one embodiment, mounting of VoltSense™ may be achieved by magnetic coupling to metallic structure of the machine to which it is attached. According to other embodiments, the VoltSense™ may be mechanically mounted to the machine structure. According to one embodiment, the power source for VoltSense™ may be the latest lithium (LI) battery technology with solar backup and recharge options. However, any suitable power source may be used with the embodiments of the invention described herein.

To establish a wireless link between the main unit (Voltek NS™) and the wireless remote units and sensors, a link cable is connected between the units. Once the link has been established and the units synchronized, the cable is unplugged and the devices will communicate with each other within their own wireless network without interference from other nearby Voltek NS™ systems. If any associated device loses its communication link, an error indicator will alert the operator at the Voltek NS™ and Volt Shadow™ control panels.

Line Defense WL™

The Line Defense WL™ is a wireless load line sensor. Again, utilizing the same wireless technology as with Voltek NS™, Voltek Shadow™ and VoltSense™, this wireless utility is the first of its kind in the world. Never before has any PWD manufacturer been able to protect the load line of a crane or mobile machinery. By attaching a proprietary connection (referred to herein as Pour Cap Link™ and discussed further below), wireless sensor, microprocessor and additional hardware to either end of the load line (lifting cable) of a crane, the sensor utilizes the load line as an extension of itself though that connection by unconventional (never realized) means. Thus the cable not only is protected but becomes part of the sensor itself. Line Defense WL™ is powered by the latest in LI technology and solar back-up and re-charge.

Line Defense WD™

The Line Defense WD™ is a wired load line sensor. Line Defense WD™ is a method of load line protection that is directly attached to the cable/load line through the Pour Cap Link™ connection at either end of the cable/load line of a crane with the Voltek NS™ hard wire antenna. Before now, the load line has been considered a single strand conductor (wire) due to way a cable is made. Therefore, a loop cannot be obtained to complete the continuity of the antenna. The inventors have designed a connection (Pour Cap Link™) that allows Voltek NS™ system to utilize the cable/load line as an extension of the sensor/antenna. Line Defense WD is a method of sensing the electrostatic field through the load line/cable powered by the main unit Voltek NS™.

Voltek Scribe

The Voltek Scribe™ is an event logger and data recorder. The Voltek Scribe™ utilizes the same technology as described above and utilized internally within Voltek NS™. The Voltek Scribe™ may be used to time and date stamp the events of any PWD. The Voltek Scribe™ comes with software for Microsoft Windows XP™ and is compatible with newer versions of operating systems and computers/laptops. According to one embodiment, the Voltek Scribe™ may be configured to store up to 3500 events. The Voltek Scribe™ may be configured to download events, view diagnostics, change options and upload new firmware to computer though an external USB port. The Voltek Scribe™ may be powered by direct connection to the battery of the machine to which it is attached or installed.

Voltek PD™

The Voltek PD™ is smaller personally worn power line sensing and warning device. The Voltek PD™ may be thought of as a condensed version of the Voltek NS™. The Voltek PD™ may be worn on the body with various carry or attachment options (clip, pouch, etc.). The Voltek PD™ may be configured with all the same features (with exception of "event logger") as Voltek NS™ with the freedom of Voltek Shadow™. The Voltek PD™ may be configured with the following features: compact (2 way radio size), audio alert, LED warning and function indicators, back-lit control panel (for night/dark conditions), waterproof, impact resistant, re-chargeable LI battery technology with charging cradle.

Pour Cap Link™

The Pour Cap Link™ is a novel connector that is monolithically attached to the end of the machine load cable. Once the Pour Cap Link™ is attached to the load line cable, either one of the Line Defense WL™ or the Line Defense WD™ can then be attached to the Pour Cap Link™ in order to utilize the load cable as part of the system sensor. Pour Cap Link™ is a "hyper-link" that magnifies or amplifies the system sensor at the load cable end. The Pour Cap Link™ is unique in that it amplifies the signal and makes a single wire/conductor (the load cable) into a closed loop sensing system.

Referring now to FIGS. 5-11, embodiments and features of a wireless power line sensing device 500 are illustrated. In one embodiment, the sensing device 500 is configured to detect 50-60 Hz AC power lines with an integral antenna or optional external, initially separate loop antenna and sends sensor readings to a remote device, such as the user interface 122 (also referred to as a base unit or master device) and/or with the remote controller 314, through two-way digital radio communication. The remote device can communicate with multiple ones of the sensing devices 500 at the same time via radio communication. As described above, the remote device takes into account the sensitivity level (for example set by the operator) and calculates the alert level based on the maximum sensor reading from all of the connected remote sensing devices 500 as well as possibly the remote device's own integral sensor.

The various embodiments and features of the wireless power line sensing device 500 described with respect to FIGS. 5-11 can be used individually or in any combination with one another, and can be used individually or in any combination with any of the embodiments described above and illustrated in FIGS. 1-4. In one embodiment, the wireless power line sensing device 500 can be used together with the user interface 122 (also referred to as a base unit) and/or with the remote controller 314 to form a wireless power line warning system. The sensing device 500 is designed to be mounted to a boom structure of a machine, such as an excavator, crane, concrete pump, or the like, to detect proximity to a power line and remotely send signals to a remote location, for example to the user interface 122 (also referred to as a base unit) and/or to the remote controller 314.

Although the sensing device 500 is described herein for sake of convenience as being configured for power line sensing, the sensing device 500, and the embodiments and features thereof, can be used in other types of sensing devices as well.

With reference to FIGS. 5A-C, the sensing device 500 includes a housing 502 having a base 504, a top wall 506, a first end 508, and a second end 510. The housing 502 houses various electronic components of the sensing device 500. The housing 502 and its individual elements can be made of any suitable material including plastic and/or metal. The base 504 includes a generally planar base plate 512 and a pair of opposite side walls 514a, 514b that extend upwardly from the base plate 512 at first and second sides, respectively, thereof. The top wall 506 includes a first edge 516a connected to the side wall 514a and extending upwardly from the base plate 512, and a second edge 516b connected to the side wall 514b and extending upwardly from the base plate 512. The portions of the top wall 506 facing the side walls 514a, 514b, including the edges 516a, 516b, are generally straight, i.e. linear or not curved. The remaining portion of the top wall 506 between the upper edges of the side walls 514a, 514b is generally continuously curved or upwardly convex so that the majority of the upper portion of the housing 502 is curved upwardly. The ends 508, 510 comprise plates that are secured to the base 504 and to the top wall 506 to close the ends of the housing 502. Preferably the housing 502 is sealed so that it is watertight and contaminant tight to prevent ingress of water and other contaminants into the interior of the housing 502.

A solar panel 520 is secured to the top wall so as to follow the curvature of the top wall 506 from the side wall 514a to the side wall 514b. The solar panel 520 is adhered or otherwise secured to the top wall 506, and includes a first edge that is disposed between the side wall 514a and the top wall 506 so that the first edge is connected to the base 504, and a second edge that is disposed between the side wall 514b and the top wall 506 so that the second edge is connected to the base 504. In addition, since the solar panel 506 follows the curvature of the top wall 506, the solar panel is generally continuously curved or upwardly convex from the first edge to the second edge so that the majority or all of the solar panel is curved.

Figure 6B:
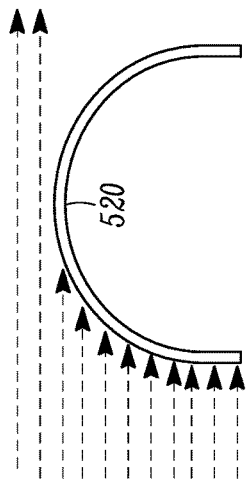
Figure 6A:
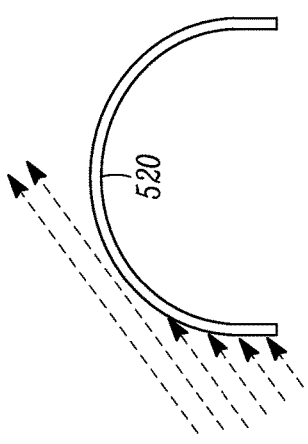
Figure 6E:
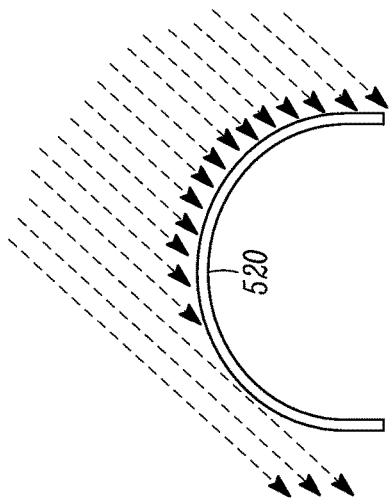
Figure 6D:
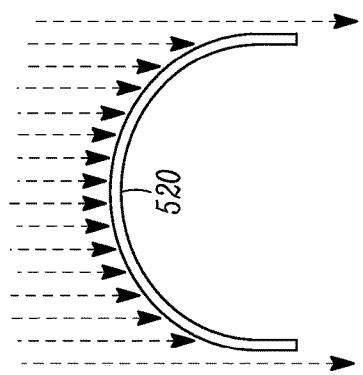
Figure 6C:
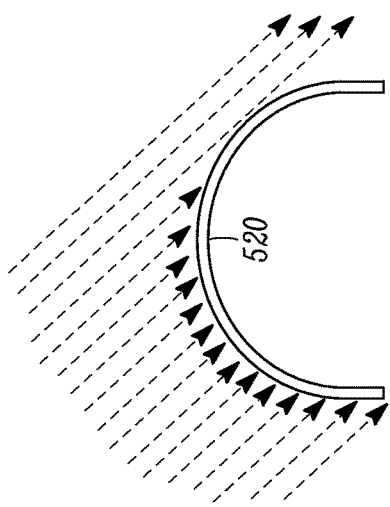
Figure 6G:
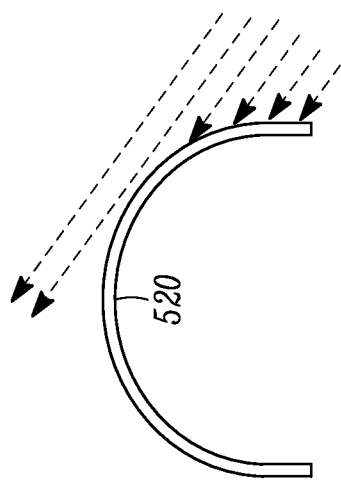
Figure 6F:
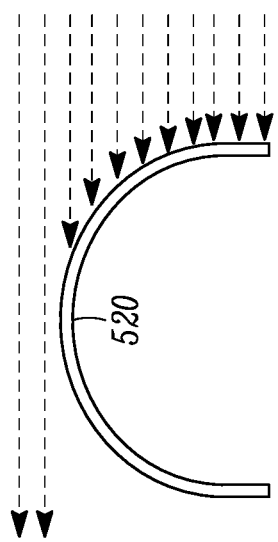

In use, the solar panel 520 is used to electrically recharge one or more rechargeable energy storage devices of the sensing device 500 as discussed further below. The solar panel 520 forms the majority of the upper surface of the device 500 to help maximize exposure to sunlight for electricity generation. In addition, as shown in FIGS. 6A-G, the curved shape of the solar panel 520 permits solar input over a wide range of angles, providing power over a longer period of time compared to if the solar panel were simply flat. FIGS. 6A-G schematically depict a sequence of angles between the sun and the solar panel 520 over the course of a day, with FIG. 6A showing morning and FIG. 6G showing late in the day. The curved solar panel 520 is continuously exposed to sunlight over the course of the day, thereby maximizing exposure to the sunlight. In one embodiment, the solar panel 520 can capture direct sunlight over a range of approximately 225 degrees.

The sensing device 500 also includes a suitable communication antenna (not shown) that is used for sending and receiving radio frequency communications, for example with the user interface 122 and/or with the remote controller 314 described previously. Further details on the radio frequency communications of the sensing device 500 is described below.

Returning to FIGS. 5A-C, the first end 508 is illustrated as including a loop antenna 522 for sensing the electromagnetic field generated by the power lines, similar to the loop antenna 102 described above. The loop antenna 522 is integral to the sensing device 500 so that the antenna 522 is intended to be an integral part of the sensing device 500 and travel with the sensing device 500 and the antenna 522 is not intended to be easily removable from the sensing device 500. In the illustrated example, the loop antenna 522 is shown as extending longitudinally from the first end 508 of the housing 502. However, the ends of the loop antenna 522 are connected to the sensing electronics inside the housing 502.

The first end 508 further includes an external charge port 524 that is electrically connected to the rechargeable power source discussed below for externally charging the power source through the charge port 524 separately from the solar panel 520. A plug of a recharging device can plug into the charge port 524 to conduct recharging. The port 524 includes a power pin that is two-way: power can go in (from the external charger or auxiliary power system 542 described below to the ultracapacitor 540 described below), or out (from the solar panel 520 to the auxiliary power system 542 described below). In one embodiment, the auxiliary power system 542 described below does not draw current from the ultracapacitor 540, but only draws current from the solar panel 520. When not in use, the charge port 524 can be closed via a suitable cap or closure device. The first end 508 also includes an external antenna port 526 that permits connection of an external loop antenna to the sensing device 500 as discussed further below. When not in use, the antenna port 526 can be closed via a suitable cap or closure device.

With continued reference to FIGS. 5A-C, the second end 510 includes an indicator light 528 that indicates a power level of the power source in the housing 502 and a status of any linking of the sensing device 500 to an external device, such as the user interface 122 and/or the remote controller 314. An optional carrying handle 530 can be formed on one of the ends 508, 510, for example the end 510, to aid a user in carrying the sensing device 500. In some embodiments, the handle 530 can also be used to help secured the sensing device 500 to the structure it is being attached to.

FIG. 5C shows that the base 502 can include a power button 532 that turns the sensing device 500 on and off, a status button 534 that can change color to indicate a status of the sensing device 500, and a charge indicator 536 that indicates a charge level of the power source of the sensing device 500. In addition, the base 502 can include at least one magnet 538 fixed thereto that can be used to attach the sensing device 500 to a metallic structure such as a boom arm. Other forms of attaching the sensing device 500 to a structure can be used instead of magnets, especially when the structure the sensing device 500 is to be attached to is not metallic.

As discussed above, the sensing device 500 includes a suitable rechargeable power source disposed within the housing 502. In one embodiment as illustrated in FIG. 7, the rechargeable power source can be one or more ultracapacitors 540. In another embodiment, the sensing device 500 can also include an auxiliary power system 542, such as one or more rechargeable batteries, additional ultracapacitor(s), or solar panel(s), as a back-up power source to the ultracapacitor 540. In still another embodiment, the sensing device 500 can include one or more rechargeable batteries as a sole power source without an ultracapacitor 540. An ultracapacitor (sometimes referred to as a supercapacitor) is defined herein as a high-capacity electrochemical capacitor with high capacitance values or devices with similar performance. An example of a suitable ultracapacitor is the Model RSCZR7308LR, 2.7 V, 300F ultracapacitor available from Ioxus, Inc. of Oneonta, N.Y. The use of the ultracapacitor 540 provides a number of advantages, such as it can be recharged in low temperature environments, it can withstand a large number of charge cycles, and it can be charged more quickly than a rechargeable battery.

The ultracapacitor 540 and/or the auxiliary power system 542 are part of a power control system 550 illustrated in FIG. 7. The ultracapacitor 540 is charged by the solar panel 520. A high-efficiency switching charger 544 with maximum power point tracking maximizes the amount of energy extracted from the solar panel 520 to charge the ultracapacitor 540. In addition, a high current external power supply 546 can be connected to the charge port 524 to quickly charge the ultracapacitor 540 via a fast charge circuit 548. The fast charge circuit 548 is a current-limited voltage regulator circuit that can charge the ultracapacitor 540 with high current (for example, 3-5 Amps or more), eventually reducing to a trickle current as a maximum voltage is reached. The high current external power supply 546 (for example, an AC to DC adapter or a cigarette lighter adapter) can plug into the charge port 524 to power the fast charge circuit 548. Also, in one embodiment, the charge port 524 can have 2 data pins to communicate with external power systems. Therefore, it is also possible to connect an external battery pack, extra solar panel and ultracapacitor, etc. The data pins of the charge port 524 allow the external charger or the auxiliary power system 542 to communicate with the main processor 552 described below to enable or disable charging (or receiving a charge) as necessary. The data pins can also be used to update the firmware of the main processor 552.

A high-efficiency switching buck/boost voltage regulator 550 maximizes the amount of energy that can be extracted from the ultracapacitor 540 as the voltage drops linearly when being discharged. The main processor 552 that includes a micro-processor, EEPROM and firmware, controls the sensing device 500 and is monitored by a watchdog and brownout detector 554 that resets the main processor 552 in the event of a firmware lockup. If the main processor 552 is not running (such as during boot-up, a brownout condition, firmware error, or hardware malfunction), the indicator light 528 illuminates to indicate an "offline" condition. While the main processor 552 is running, the indicator light 528 is off.

The main processor 552 monitors power system status including solar panel 520 input voltage and current, ultracapacitor 540 voltage and charge/discharge current via a voltage monitor 556, main voltage regulator 550 voltage and current, external charging status, and ambient temperature via an ambient or external temperature monitor 558. The firmware running on the main processor 552 can use this data for power-conserving and diagnostic features. The main processor 552 can turn power on and off for subsystems 560 via a subsystems power control 562 to conserve power. The subsystems 560 can be circuits that the main processor 552 can communicate with through digital I/O. Examples of subsystems 560 can include, but are not limited to, the power line sensing control scheme illustrated in FIG. 10, voltage or current or temperature monitors, radio communications, serial communications, infrared receivers, and LED controllers. The subsystems power control 562 provides the ability to control power consumption of each subsystem. Depending on the design of each subsystem, this could include, but is not limited to, controlling MOSFETs to turn power on or off for each subsystem, or putting subsystems to sleep via sleep control pins.

The ultracapacitor 540 is put under increasing stress as the charge voltage and temperature increases, which can greatly reduce the lifespan of the ultracapacitor 540. To prolong the lifespan of the ultracapacitor 540, the main processor 552 can determine the maximum allowed voltage as the temperature increases, and can disable charging via charge cutoff logic 564 if the ultracapacitor 540 voltage exceeds the calculated maximum allowed voltage.

The "status" button 534 on the bottom of the sensing device 500, when pressed, causes the charge indicator 536, which in one embodiment can be an LED bar graph, to indicate the approximate charge level of the ultracapacitor 540 for a period of time, for example a few seconds. If the external power supply 546 is connected via the charge port 524, the charge indicator 536 turns on automatically to display charging progress.

As indicated above, the sensing device 500 communicates with an external master device 570, such as the user interface 122 and/or the remote controller 314, through digital two-way radio communication, which in one embodiment is configured before operation of the sensing device 500. FIG. 8 illustrates an example of a linking scheme for linking the sensing device 500 with the master device 570 to configure the sensing device 500. As illustrated in FIG. 8, the sensing device 500 includes a wireless communication mechanism 572, such as a radio frequency (RF) transceiver, and an infrared receiver 574. The status button 534 on the sensing device 500 also forms a "link" button that is used to initiate communication configuration of the sensing device 500. The master device 570 also includes wireless communication mechanism 576, such as an RF transceiver, an infrared transmitter 578, and a "link" button 580.

Configuration of the RF communication between the sensing device 500 and the master device 570 is accomplished by putting the master device 570 and the sensing device 500 into "linking mode" by pressing the "link" buttons 534, 580 on both devices, then orienting the sensing device 500 and the master device 570 relative to one another in such a position that the infrared receiver 574 can read configuration data from the master device's 570 infrared transmitter 578. Link configuration firmware 582 is the part of the firmware that handles the infrared linking process and radio transceiver configuration. Link configuration data includes, but is not limited to, a network ID, the master device's 570 address, and the sensing device's 500 address. During the linking process, this data is stored in the EERPOM and used to send configuration commands to the radio transceiver module. This data originates from the master device 570. Once the sensing device 500 receives the configuration data, the sensing device 500 begins communicating with the master device 570, for example by two-way RF communications using the RF transceivers 572, 576.

The two-way communication allows the master device 570 and the remote device 500 to communicate status, commands, error codes, or other data. Also, once the sensing device 500 begins communicating with the master device 570 via the communication mechanism 572, the master device 570 obtains the serial number of the newly-linked sensing device 500 for logging purposes.

With reference now to FIGS. 9A, 9B and 10 together with FIG. 3, the operation of the sensing device 500 configured as a power line sensing device is explained. The sensing device 500 is configured to detect electromagnetic fields around AC power lines, and transmit sensor readings to the master device 570 via RF or other wireless communication technology. One or more of the sensing devices 500 are mounted at a suitable location(s) on an extendable boom 590 of a machine 592 such as an excavator, crane, concrete pump, cherry picker, or the like. In one embodiment, a single sensing device 500 can be mounted to the boom 590. In another embodiment, a plurality of the sensing devices 500 can be mounted to the boom 590 at spaced locations along the length to form a sensing field 594 along the majority of the length thereof as illustrated in FIG. 9A. In still another embodiment, a single sensing device 500 can be mounted to the boom 590, and an external loop antenna 596 can be connected to the sensing device 500 and arranged along the remaining length of the boom 590 to extend the coverage of the sensing device 500, to form the sensing field 594 along the majority of the length of the boom 590 as illustrated in FIG. 9B.

With reference to FIG. 10, a sensing control scheme of the sensing device 500 is illustrated. The sensing device 500 includes the integral loop antenna 522. In addition, the external loop antenna 596 can optionally be used with the sensing device 500 by plugging the external loop antenna into the external antenna port 526. When the sensing device 500 is first turned on, it tests for the presence of the external loop antenna 596. If found, the external loop antenna 596 is used and the integral loop antenna 522 is temporarily disabled. If the external loop antenna 596 is not found, the integral loop antenna 522 is used. Whichever antenna 522, 596 is currently in use, it is tested periodically. Test signal generators 602, 604, one for the integral loop antenna 522 and one for the external loop antenna 596, send either a test signal through the integral loop antenna 522 (using the test signal generator 602) if the external loop antenna 596 is not connected or sends an external test signal 604 through the external loop antenna 596 (using the external test signal generator) if the external loop antenna is connected. In one embodiment, each test signal generator 602, 604 can include a software (micro-controller) square wave frequency generator whose output is connected to a simple capacitor/resistor circuit that conditions the signal to approximate a sine wave. The frequency can be changed to test both passing and blocking of various frequencies. The main processor 552 verifies that the entire sensor signal path is functional. If the test fails, an error code 608 is transmitted by the sensing device 500 to the master device 570 and tests can be performed continuously until the test passes, then the sensing device 500 will resume normal operation again. Once the external antenna 596 is in use, if it is removed without rebooting the sensing device 500, an antenna failure is assumed. To resume operation with the integral loop antenna 522, the sensing device 500 must be rebooted after disconnecting the external antenna 596.

The sensing control scheme in FIG. 10 also includes a bandpass filter 610 that requires no calibration and is not greatly affected by temperature which ensures accurate filtering of unwanted frequencies. In one embodiment, the bandpass filter 610 can be configured for 45 Hz-65 Hz so that it is equally sensitive to U.S. or international power lines without modification. However, configuration of the bandpass filter 610 for other frequencies is possible. An amplifier 612 with digitally-controlled gain automatically reduces gain if the signal is strong enough to cause clipping. An accurate RMS-to-voltage converter 614 read by an analog to digital converter (ADC) 616 obtains an accurate power measurement of the incoming signal. The main processor 552 processes the ADC samples and calculates a final sensor reading by applying an expansion/compression/limiting curve and an averaging algorithm 618, which is calibrated to have desired dynamic behavior.

The sensing device 500 then transmits an output 620 to the master device 570 that is indicative of the strength of the electromagnetic field detected by the sensing device 500. As described above with respect to FIGS. 1-4, the sensitivity level 622 of the master device 570 can be adjusted. Antenna selection and testing logic 623 is the part of the firmware that monitors sensing device 500 output and calculated alert level and decides when to perform a test or detect the presence of the external antenna 596. The logic 623 controls an antenna switch 624 and the software frequency generators for the test signals by the test signal generators 602, 604. The logic 623 can also output a status/error code, which is sent to the master device 570 along with an output value of the sensing device. The antenna switch 624 can be an analog SPDT switch controlled by the micro-controller that selects one of two inputs (i.e. the input from the integral loop antenna 522 or the input from the external loop antenna 596) to be output to the rest of the sensing device circuit. A transient voltage protection circuit 625, such as a diode array, can also be provided to protect the circuit in FIG. 10 from electrostatic discharge.

Returning to FIGS. 9A and 9B, when using the integral loop antenna 522, the individual sensing field 594 generated by the antenna 522 is generally in the shape of a sphere. This shape of the sensing field 594 is believed to be adequate for some smaller equipment permitting a single one of the sensing devices 500 to be used. However, in certain applications, such as on cranes or concrete pumps with long and/or extendable boom sections, a plurality of the sensing devices 500 may be necessary to achieve adequate coverage of the boom 590. FIG. 9A illustrates a plurality of the sensing devices 500 along the boom 590, with the individual sensing fields of each sensing device 500 creating recesses 630 in the overall sensing field 594 due to the spherical shape of each sensing field. The recesses 630 may allow parts of the boom 590 to get closer to power lines than intended without triggering a warning or shutdown. In addition, if the sensing devices 500 are spaced too far apart from one another on the boom 590, the recesses 630 become larger and more pronounced and, if spaced far enough apart, gaps in the overall sensing field 594 can be created thereby leaving portions of the boom 590 uncovered by the sensing devices 500 and exposed to possible contact with the power lines. The use of multiple sensing device 500 also increases costs by requiring the user to purchase and maintain the multiple sensing devices 500.

However, the ability to plug in the external loop antenna 596 to the sensing device 500 alleviates the above-noted concerns regarding multiple sensing devices 500. As illustrated in FIG. 9B, the external loop antenna 596 can be attached to the sensing device 500 which disables the integral loop antenna 522. The external loop antenna 596 can be run linearly along the entire length of the boom 590 or just along a boom section. By extending the external loop antenna 596 linearly along the boom 590, a more consistent sensing field 594 is generated around the boom 590 without the recesses 630. In addition, use of the external loop antenna 596 reduces the number of sensing devices 500 that need to be purchased and maintained.

In power line sensing applications where the sensing device 500 is mounted on the boom 590, the sensing device 500 is not easily or readily accessible. In addition, all power for operating the sensing device 500 comes from its internal power supply such as the ultracapacitor 540. Therefore, power should be conserved as much as possible.

FIG. 11 illustrates an example of a power control scheme that can be implemented to conserve power use by the sensing device 500. In FIG. 11, solar panel current going from the solar panel 520 into the ultracapacitor charger 544 is monitored by a monitor 632, solar panel voltage monitored by a monitor 634, ultracapacitor current going into (positive value) or out of (negative value) the ultracapacitor 540 monitored by a monitor 636, and ultracapacitor voltage monitored by the monitor 556 are used to determine how important it is to conserve power. A calculated alert level circuit 638 and a master device awake status circuit 640 determine when power needs to be used to perform a function. The solar panel voltage monitor 634 indicates if the solar panel 520 is receiving too little, enough, or an excess amount of sunlight, and is affected by how much current is going into the ultracapacitor 540. The fuller the ultracapacitor 540 gets, the less current is accepted and the higher the solar panel voltage may climb in direct sunlight. The ultracapacitor current monitor 636 indicates whether or not the solar panel 520 is able to provide enough current to overcome demand current and charge the ultracapacitor 540. The ultracapacitor voltage monitor 556 provides a fairly accurate representation of how fully charged the ultracapacitor 540 is. Power saving logic 642 considers these inputs to maximize charging rate or reduce discharging rate whenever possible while providing quick sensor response time whenever necessary.

The control scheme provides the sensing device 500 with an active mode and a standby mode via active/standby logic 644. In active mode, the sensing device 500 is active and the sensing device 500 can communicate with the master device 570. If the master device 570 stops communicating with the sensing device 500 after a timeout period, the sensing device 500 turns off the power line sensor circuit shown in FIG. 10 via on/off logic 646 and goes into a low-power state. In this state, the RF transceiver 572 is monitored much less frequently than when in active mode. If the master device 570 tries to communicate again, the sensing device 500 will return to active mode again. In addition, radio communications on/off logic 650 can turn on/off the RF transceiver 572, for example corresponding to when the sensing device 500 is turned on/off by the on/off logic 646.

The control scheme can also include radio communication wake/sleep timing logic 652. The logic 652 can place the radio communications of the sensing device 500 in a wake or sleep mode. The sensing device 500 can sleep to minimize power consumption, be woken up periodically to transmit and/or receive data, and then be put back into sleep mode. With the logic 652, the RF transceiver 572 sleeps between communication cycles. The interval between these communication cycles is determined by the ultracapacitor and solar panel voltage/current, and what "alert level" the system is in. To determine the alert level, the sensing device 500 predicts what the master device 570 would display on the "field strength bar" 210 (see FIG. 2) by plugging the current sensor output 620 into the same formula the master device 570 uses to calculate the field strength. This alert level calculation only affects power saving logic. It does not affect what sensor reading is transmitted to the master device 570. To additionally save power, the control scheme can also include processor clock speed control logic 654. The logic 654 can change the clock speed of the main processor 552 to minimize power consumption.

The master device 570 takes the values from all linked sensing devices 500 and, in some embodiments, its own integral sensor and compares them to find the maximum value. This maximum value and the current sensitivity level go into a formula to calculate the final field strength value, which is displayed on the field strength bar 210. The antenna selection and testing logic 623 needs to know when it is safe to perform an antenna test. If a test is performed while the equipment is near a power line, it would interrupt the ability to detect the power line. Similarly, the power saving logic 642 needs to know when response time is a high priority (operating near a power line) versus a low priority (far away from a power line) in order to conserve power whenever possible.

Returning to FIG. 10, the sensing device 500 needs to know how close it is to a power line, or in other words, it needs to know if it is currently in the green, yellow, or red zone. There is no way to determine the remote sensor's distance from the power line by the sensor output 620 itself, because it only represents field strength, which varies greatly with different power line voltages, antenna configurations, etc. For example, in one situation, a measured field strength could represent 10 feet from a power line, while in another situation that same measured field strength could mean 100 feet from a power line.

So the circuit in FIG. 10 includes calculated alert level logic 648. Periodically, the master device 570 transmits its current sensitivity level to the sensing device 500. The sensing device 500 then predicts what the master device 570 would display on the field strength bar 210 based on its current sensor output value 620 and master device sensitivity level 622. This predicted value is referred to as the "alert level". If the alert level is below a certain value (bottom of the green zone), a test may be performed. The higher the alert level (for example, the top of the green zone, or in the yellow or red zone), the more frequently the sensing device 500 transmits sensor values to the master device 570. If there are multiple sensing devices 500 on a long boom arm of a large machine, the sensing devices 500 further away from power lines will be "quiet" most of the time so that sensing devices 500 closest to the power lines will be able to transmit more frequently with less interference.

If the calculation predicts the field strength bar 210 would be near the top of the green (safe), in the yellow (warning), or red (shutdown) zone, then the sensing device 500 is placed in a high alert level, meaning that response time takes priority over power conservation, so the sensing device 500 will transmit every time the sensor reading changes at all, or on a predetermined timer interval if the sensor reading of the sensing device 500 does not change. If the calculation predicts the field strength bar 210 would be below the top of the green (safe) zone, then the sensing device is placed in a low alert level, meaning that power conservation takes priority over response time, so the sensing device 500 will transmit sensor readings only if the sensor reading changes more than a predetermined amount or on a longer predetermined timer interval. If the alert level is near or at the bottom of the green (safe) zone, a sensor self-test may be performed periodically.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A wireless power line sensing device, comprising:
a housing having a base, a first end, and a second end;
a power source disposed in the housing;
a controller in the housing that is connected to the power source and is powered thereby;
an integral loop antenna that senses an electromagnetic field generated by a power line, the integral loop antenna is connected to the controller;
a wireless communication mechanism in the housing and connected to the controller, the wireless communication mechanism is electrically connected to the power source so as to be electrically powered thereby;
an external antenna port on the housing, the external antenna port is electrically connected to the controller and permits connection of an external loop antenna to the housing; and
an external loop antenna connected to the external antenna port, the external loop antenna senses the electromagnetic field generated by a power line, the external loop antenna is substantially linear so that in use the external loop antenna extends longitudinally over a length of a structure to which it is attached to define a non-spherical electromagnetic sensing field.

2. The wireless power line sensing device of claim 1, wherein the power source comprises an ultracapacitor.

3. The wireless power line sensing device of claim 1, wherein the wireless communication mechanism comprises a radio frequency transceiver.

4. A wireless power line warning system, comprising:
the wireless power line sensing device of claim 3; and
a base unit that includes a radio frequency transceiver that can communicate with the radio frequency transceiver of the wireless power line sensing device.

5. The wireless power line warning system of claim 4, further comprising a remote control unit that interfaces with the wireless power line sensing device and with the base unit.

6. The wireless power line warning system of claim 5, wherein
the remote control unit determines an alert level based on a current sensor output value transmitted by the wireless power line sensing device and a current sensitivity level, and
the remote control unit automatically shuts down a machine to which the wireless power line sensing device is attached when the alert level exceeds an auto-shutdown threshold.

7. The wireless power line sensing device of claim 1, wherein the power source is a rechargeable power source, and further comprising a solar panel mounted on an exterior of the housing and electrically connected to the power source to electrically charge the power source.

8. The wireless power line sensing device of claim 1, further comprising at least one magnet fixed to the base of the housing that attaches the housing to a metallic structure.

9. The wireless power line sensing device of claim 1, further comprising a charge indicator on the base of the housing that indicates a charge level of the power source.

10. The wireless power line sensing device of claim 1, further comprising at least one indicator light on the first end or the second end of the housing.

11. The wireless power line sensing device of claim 1, further comprising a power button on the base of the housing that turns the wireless power line sensing device on and off, and a status button on the base of the housing that can change color to indicate a status of the wireless power line sensing device.

12. The wireless power line sensing device of claim 1, wherein the controller disables the integral loop antenna.

13. The wireless power line sensing device of claim 1, wherein the base of the housing is substantially flat, and the housing further includes a top wall extending from the base, at least a portion of the top wall is curved.

14. A wireless power line sensing device of claim 1, wherein the integral loop antenna extends from and outside of the housing.

15. A wireless power line sensing device, comprising:
a housing;
an ultracapacitor disposed in the housing that stores electrical energy;
a solar panel mounted on an exterior of the housing and electrically connected to the ultracapacitor to electrically charge the ultracapacitor;
a sensing mechanism including a loop antenna that senses an electromagnetic field generated by a power line, the loop antenna extending from and outside of the housing, the sensing mechanism is electrically connected to the ultracapacitor so as to be electrically powered thereby;
a controller in the housing that is connected to and controls the sensing mechanism, the controller is electrically connected to the ultracapacitor so as to be electrically powered thereby; and
a radio frequency transceiver in the housing and connected to the controller, the radio frequency transceiver is electrically connected to the ultracapacitor so as to be electrically powered thereby.

16. The wireless power line sensing device of claim 15, further comprising a rechargeable battery disposed in the housing, the rechargeable battery stores electrical energy; the rechargeable battery is selectively electrically connectable to the solar panel so as to be rechargeable by the solar panel; and the rechargeable battery is selectively electrically connectable to the sensing mechanism, the controller, and the radio frequency transceiver to provide electrical power thereto.

17. The wireless power line sensing device of claim 15, further comprising an external charge port on the housing that is electrically connected to the ultracapacitor so that the ultracapacitor can be charged through the external charge port.

18. The wireless power line sensing device of claim 15, wherein
the controller, via the radio frequency transceiver, transmits a current sensor output value at a preset timer interval or when the current sensor output value has changed from a previous sensor output value by more than a predetermined amount, and
the controller determines a field strength value based on a current sensitivity level and the current sensor output value, and the controller adjusts the preset timer interval or the predetermined amount based on the field strength value.

19. The wireless power line sensing device of claim 18, wherein the current sensitivity level is received from a remote device via the radio frequency transceiver.

20. A wireless sensing device, comprising:
a housing including a base with a first side and a second side;
a power source disposed in the housing that stores electrical energy;
a solar panel mounted on an exterior of the housing and electrically connected to the power source to electrically charge the power source, the solar panel includes a first edge that contacts the first side of the base and a second edge that contacts the second side of the base, and the solar panel is continuously curved from the first edge to the second edge;
a sensing mechanism connected to the housing that senses a condition external to the housing, the sensing mechanism is electrically connected to the power source so as to be electrically powered thereby;
a controller in the housing that is connected to and controls the sensing mechanism, the controller is electrically connected to the power source so as to be electrically powered thereby; and
a radio frequency transceiver in the housing and connected to the controller, the radio frequency transceiver is electrically connected to the power source so as to be electrically powered thereby.

* * * * *